(12) United States Patent
Cheng et al.

(10) Patent No.: US 7,253,121 B2
(45) Date of Patent: Aug. 7, 2007

(54) METHOD FOR FORMING IMD FILMS

(75) Inventors: Yi-Lung Cheng, Danshuei Township, Taipei County (TW); Miao-Cheng Liao, Yunlin Hsien (TW); Ying-Lang Wang, Longjing Township, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 301 days.

(21) Appl. No.: 10/937,215

(22) Filed: Sep. 9, 2004

(65) Prior Publication Data

US 2006/0051973 A1   Mar. 9, 2006

(51) Int. Cl.
*H01L 21/471* (2006.01)

(52) U.S. Cl. .................. 438/778; 438/784; 438/786; 427/249.15

(58) Field of Classification Search ............... 438/786
See application file for complete search history.

(56) References Cited

U.S. PATENT DOCUMENTS

| | | | |
|---|---|---|---|
| 6,060,404 A | 5/2000 | Ngo et al. ................ 438/778 |
| 6,255,233 B1* | 7/2001 | Smith et al. .............. 438/786 |
| 6,486,059 B2 | 11/2002 | Lee et al. |
| 6,544,900 B2 | 4/2003 | Raaijmakers et al. |
| 6,562,725 B2 | 5/2003 | Tsai et al. |
| 6,576,545 B1* | 6/2003 | Hopper et al. ............ 438/624 |
| 6,875,687 B1* | 4/2005 | Weidman et al. ......... 438/623 |
| 2002/0054962 A1* | 5/2002 | Huang ..................... 427/533 |
| 2004/0150110 A1* | 8/2004 | Usami et al. ............. 257/756 |

* cited by examiner

Primary Examiner—Stephen W. Smoot
(74) Attorney, Agent, or Firm—Thomas, Kayden, Horstemeyer & Risley

(57) ABSTRACT

A method for forming IMD films. A substrate is provided. A plurality of dielectric films are formed on the substrate, wherein each of the dielectric layers are deposited in-situ in one chamber with only one thermal cycle.

5 Claims, 4 Drawing Sheets

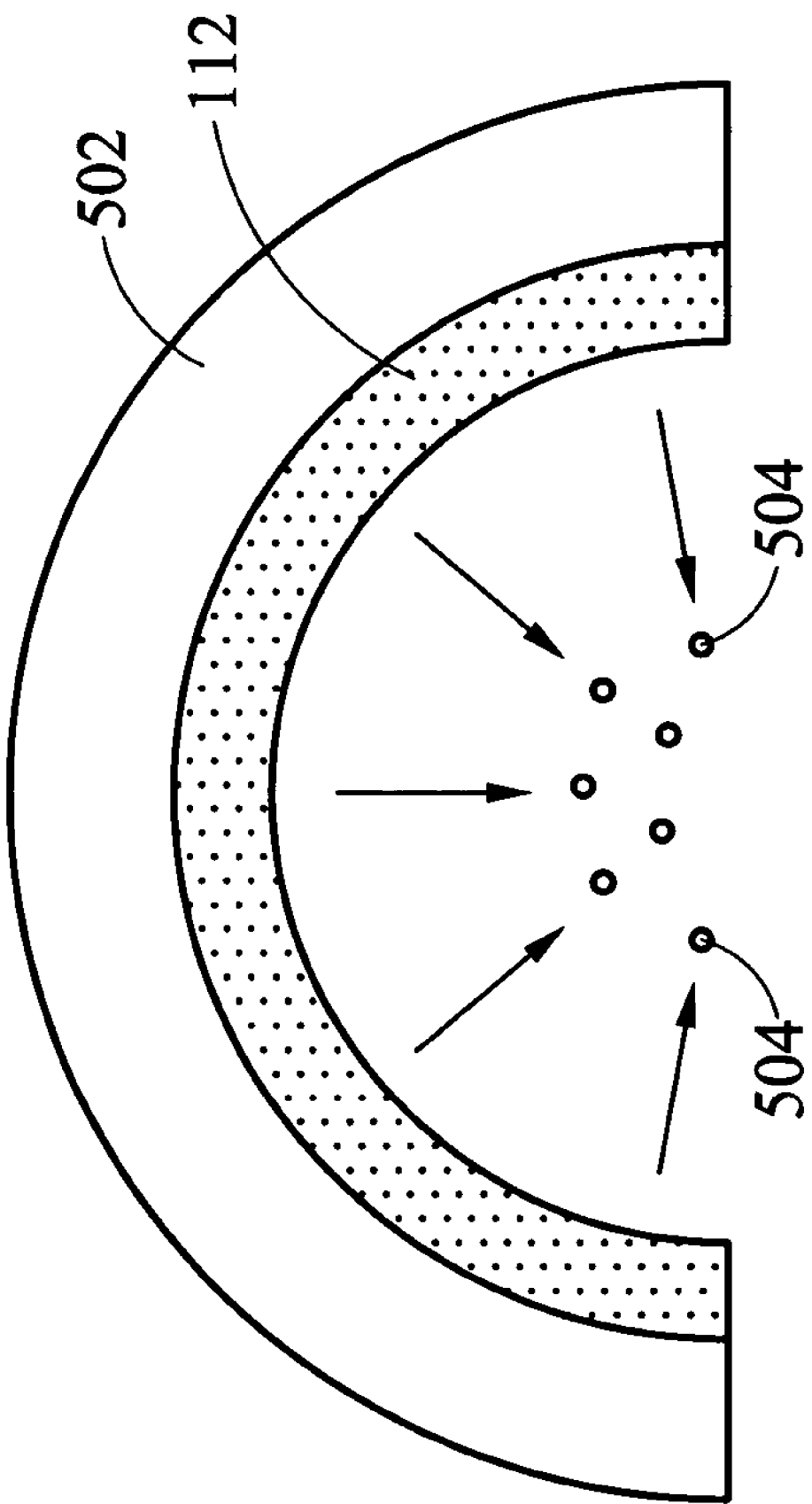

METHOD FOR FORMING IMD FILMS

BACKGROUND

The invention relates to a method for fabricating a semiconductor device, and more particularly, to a method for forming inter metal dielectric films (IMD).

Advances in semiconductor manufacturing technology have led to the development of integrated circuits with multiple interconnect levels. In an integrated circuit, patterned conductive material on one interconnect level is electrically insulated from patterned conductive material on another interconnect level by films of material such as silicon dioxide.

A consequence of separating patterned conductive material with insulating materials, whether the conductive material is used on a single level or multiple levels, is the formation of undesired capacitors. The parasitic capacitance between patterned conductive material, or more simply, interconnects, separated by insulating material on microelectronic devices contributes to effects such as RC delay, unnecessary power dissipation, and capacitively coupled signals, also known as cross-talk.

One way to reduce unwanted capacitance is to increase the distance between the interconnects. Increased spacing between interconnect lines, however, has adverse consequences, such as increased area requirements and corresponding increases in manufacturing costs. Another way to reduce the unwanted capacitance between the interconnects is to use an insulating material with a lower dielectric constant.

Typically a low k IMD layer comprises a barrier layer on a semiconductor substrate to avoid diffusion from the low k material to the semiconductor substrate. A typical dual damascene interconnect architecture requires a barrier layer, a lower IMD layer, a stop layer, an upper IMD layer and an anti-reflective layer. In the conventional method, the described films are formed in different chambers, and the substrate is heated and then cooled during transfer from one chamber to another. Thus, the substrate is subjected to at least five thermal cycles before a dual damascene architecture can be formed, which is a waste of thermal budget. An excessive number of thermal cycles also reduces throughput. Moreover; the Cu metallization reliability is affected by the thermal budget. A process which requires fewer thermal cycles and lower thermal budget is therefore desirable.

U.S. Pat. No. 6,060,404 discloses an in-situ deposition method for formation of a dielectric layer suitable for use in forming a conductive path in a semiconductor wafer. The method includes depositing a thin $SiO_xN_y$ stop layer on top of a semiconductor wafer within a chemical vapor deposition (CVD) reactor chamber under low pressure, maintaining the low pressure following the deposition of the $SiO_xN_y$ stop layer, and then depositing a thick TEOS oxide dielectric layer on the $SiO_xN_y$ stop layer. The in-situ deposition process reduces outgassing defects that would normally form at the interface between the SiON stop layer and the TEOS oxide dielectric layer.

SUMMARY

Embodiments of the invention achieve technical advantages by forming a plurality of dielectric films in one chamber.

In accordance with an embodiment of the invention, a method for forming inter metal dielectric layers (IMD) is disclosed. A substrate is provided and a plurality of dielectric films are formed on the substrate, wherein the dielectric films are formed in one chamber and the dielectric films comprise at least one low k film with a k factor below 4. An embodiment of the invention additionally provides a method for forming a plurality of dielectric films on the substrate. The dielectric films are formed at a process temperature, and the substrate is kept at the process temperature until all the dielectric films are formed.

An embodiment of the invention provided a method for forming inter metal dielectric layers (IMD). A substrate is placed in a chemical deposition chamber. A first precursor gas is introduced to the chamber while heating the substrate to an elevated temperature, thereby depositing a first dielectric layer on the substrate. The first precursor gas is pumped out of the chamber while maintaining the substrate in the chamber at the elevated temperature. A second precursor gas is introduced to the chamber while maintaining the substrate at the elevated temperature thereby depositing a second dielectric layer on the first dielectric layer. The second precursor gas is then pumped out of the chamber, and a third precursor gas is introduced to the chamber thereby depositing a third dielectric layer on the second dielectric layer. The third precursor gas is pumped out of the chamber, and a fourth precursor gas is introduced to the chamber thereby depositing a fourth dielectric layer on the third dielectric layer, the fourth precursor gas is pumped out of the chamber, and a fifth precursor gas is introduced to the chamber thereby depositing a fifth dielectric layer on the fourth dielectric layer.

BRIEF DESCRIPTION OF THE DRAWINGS

The invention can be more fully understood by reading the subsequent detailed description in conjunction with the examples and references made to the accompanying drawings, wherein:

FIG. 5 is a local view of a chamber wall.

DETAILED DESCRIPTION

Figure 1:
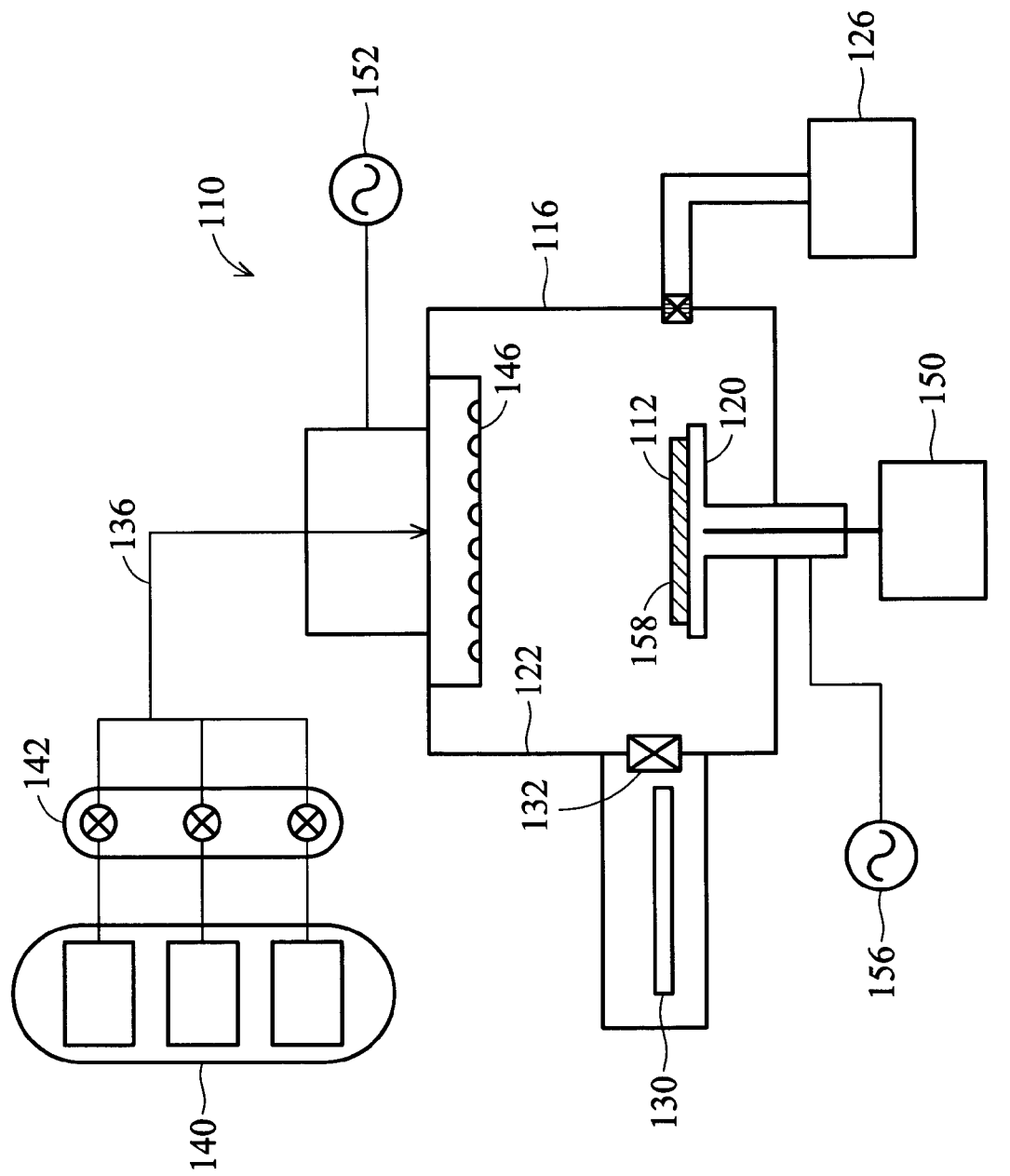
FIG. 1 is sketch map of an apparatus for forming IMD films.

Embodiments of the invention, which provide method of depositing IMD layers, will be described in greater detail with reference to the accompany drawings. Noted that in the accompanying drawings, like and/or corresponding elements are referred to by like reference numerals. Although embodiments of the method of the invention are explained with reference, to formation of an exemplary dual damascene IMD architecture, it will be appreciated that the process may be equally used in forming other dielectric films. The method particularly advantageously used in the formation of copper dual damascene features with low-k IMDS.

FIG. 1 is a schematic illustration of a suitable apparatus 110 for carrying out a chemical vapor deposition (CVD) on a substrate such as wafer 112. Apparatus 110 includes a chamber 116 of a size suitable for holding one or more wafers 112, which are supported in the chamber on a chuck 120. As is typical of such chambers, the interior 122 can be evacuated or pressurized as desired by a suitable pump and valve apparatus schematically illustrated in FIG. 1 by pump 126. Individual wafers 112 are moved in and out of chamber 116 by a suitable wafer handler 130 through a gate valve 132 in the chamber wall, allowing wafers to be moved onto chuck 120 for processing, and then removed from the chamber 116.

Selected gases used in CVD processing are introduced into the chamber through a suitable manifold system 136 from various gas supply reservoirs indicated collectively at 140, controlled by valves 142. The gas comprises the gas required for depositions of at least a low k IMD film, a barrier layer and anti-reflective layer. For example, the gas supply reservoirs comprise individual reservoirs respectively storing SiH(CH3)3 (TMS), SiH4, N2O, NH3, O2, N2 and He. The gases are introduced into the chamber 116 through an element referred to as a shower head 146, which distributes the gases as required. Chuck 120 can be heated to any desired temperature, the heating element for this purpose being schematically depicted as heater 150. The heater 150 and chuck 120 are used to select the temperature of wafer 112 during CVD processing.

Plasma energy can be supplied to the chamber 116 through an RF generator 152 which supplies high frequency (HF) RF power radiated through shower head 146. The industry standard for HF plasma energy use is 13.56 megahertz (MHz), although the invention is not limited to any exact high frequency value. The RF generator is not worked if the deposition is only a thermal reaction. Apparatus 110 preferably also includes a low frequency (LF) generator 156 for supplying LF power to the interior of the chamber. The manner of applying LF power between the chuck 120 and shower head 146 is well known. LF power can be used to increase crosslinking in the amorphous fluorinated carbon (a-F:C) film deposited on wafer 112 during CVD processing. In addition, a HF generator 152 can be connected to the gas inlet.

Figure 2:
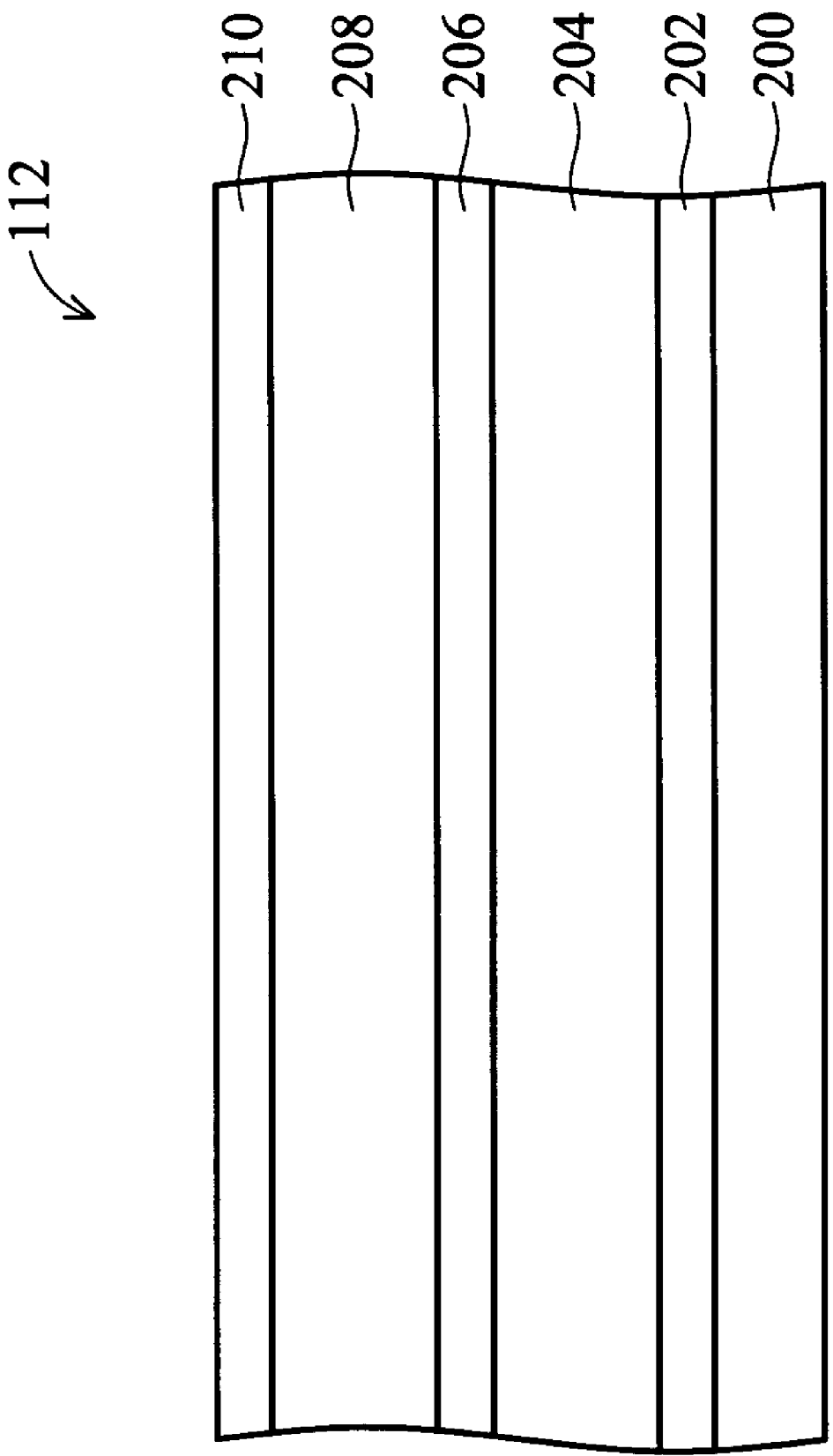
FIG. 2 is a cross section of on IMD film.

FIG. 2 depicts a cross-section of an IMD scheme in accordance with an embodiment of the invention, wherein each of layers 202, 204, 206, 208 and 210 are deposited in the same chamber in sequence with only one thermal cycle. A substrate 200 is provided, which may be a semiconductor substrate or glass substrate, where the term "substrate" may comprise layers or interconnects or other features formed thereon.

Referring to FIG. 1 and FIG. 2, a barrier layer 202 is formed, by deposition, for example, on the substrate 200. The barrier layer 202, in an embodiment, is made of hydrogen doped silicon carbon nitride (SiCN:H). During processing, the valves 142 controlling TMS, NH3 and He are opened, and thus the selected gases are mixed and introduced into the chamber 116. The wafer 112 is heated to 300° C.~500° C. and the chamber 116 has a pressure of 3~5 Torr when depositing the barrier layer 202. The barrier layer 202 protects the substrate or underlying layer, preventing contamination by subsequent low k materials.

A lower IMD layer 204 is then formed on the barrier layer. Preferred dielectric materials for the lower IMD layer 204 are low k (i.e., k<4) dielectric materials.

The low k materials can be a silicon dioxide based low k dielectric material, such as hydrogen silsesquioxane (HSQ) or SiOF. Preferably, the low k dielectric material is SiOC:H (black diamond). Before depositing the lower IMD layer 204, the residue gas remaining after depositing the barrier layer 202, such as NH3 and He, must be pumped out. The valves 142 controlling TMS, and O2 are opened, thus the selected gases are mixed and introduced into the chamber 116. The temperature of the wafer 112 is kept at 300° C.~500° C. and the chamber 116 has a pressure of 3~5 Torr for deposition of the lower IMD layer 204. Note that the wafer 112 is not moved out of the chamber between the two depositions, and the lower IMD layer is deposited in-situ, and preferably the temperature is not ramped up or down throughout the two depositions thus reducing the thermal budget and processing time.

A stop layer 206 is deposited on the lower IMD layer 204, as depicted in FIG. 2. The stop layer can be substantially composed of hydrogen doped silicon carbon nitride (SiCN:H). Before deposition thereof, however, the residue gases remaining after depositing the lower IMD layer 204, such as O2 must be pumped out. During processing, the valves 142 controlling TMS, NH3 and He are opened, thus the selected gases are mixed and introduced into the chamber 116. The temperature of the wafer 112 is held at 300° C.~500° C. and the chamber 116 has a pressure of 3~5 Torr for deposition of the stop layer. The stop layer 206 is formed in the same chamber 116 with the barrier layer 202 and the lower IMD layer 204.

Next, an upper IMD layer 208 is formed on the stop layer 206. The upper IMD layer 208 also comprises low k (i.e., k<4) dielectric materials.

In this embodiment, the low k material can be a silicon dioxide based low k dielectric material, such as hydrogen silsesquioxane (HSQ) or SiOF. Most preferably, the low k dielectric material is hydrogen doped silicon oxide carbide SiOC:H (black diamond). The residue gas after deposition of the stop layer 206, such as NH3 and He must be pumped out. The valves 142 controlling TMS, and O2 are opened, thus the selected gases are mixed and introduced into the chamber. The temperature of the wafer 112 is held at 300° C.~500° C. and the chamber has a pressure of 3~5 Torr to deposit the low k IMD layer. The wafer 112 is not moved out of the chamber 116 and the upper IMD layer 208 is deposited in-situ.

Last, the residual gases, such as TMS and O2, remaining after formation the upper IMD layer 208 are pumped out. SiH4, N2O and N2 are introduced into the chamber 116 to deposit silicon oxide nitride as the ARC layer 210 without transferring the wafer 112 to another chamber for deposition.

As described above, all the dielectric films required for a dual damascene scheme are deposited in the same chamber, and the wafer only goes through one thermal cycle. In comparison with the conventional technology, the described dielectric films are deposited in different chambers and require at least five thermal cycles. Note that, the described five dielectric layers are required only for one level of metallization. If nine-level metallizations are required for a product, the wafer will go through 45 thermal cycles.

Figure 3:
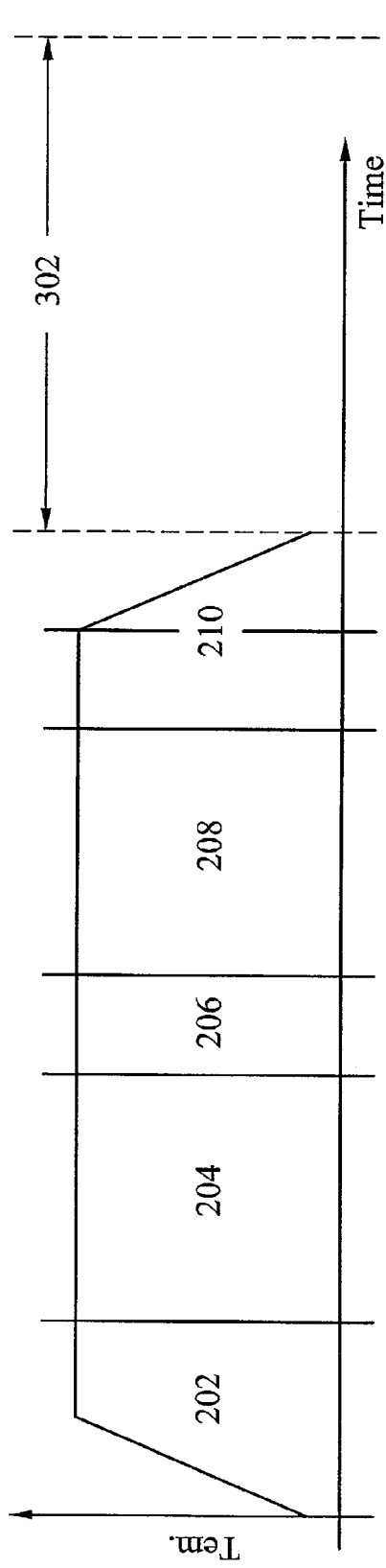
FIG. 3 is a chart showing the thermal cycles of an embodiment of the present method.
Figure 4:
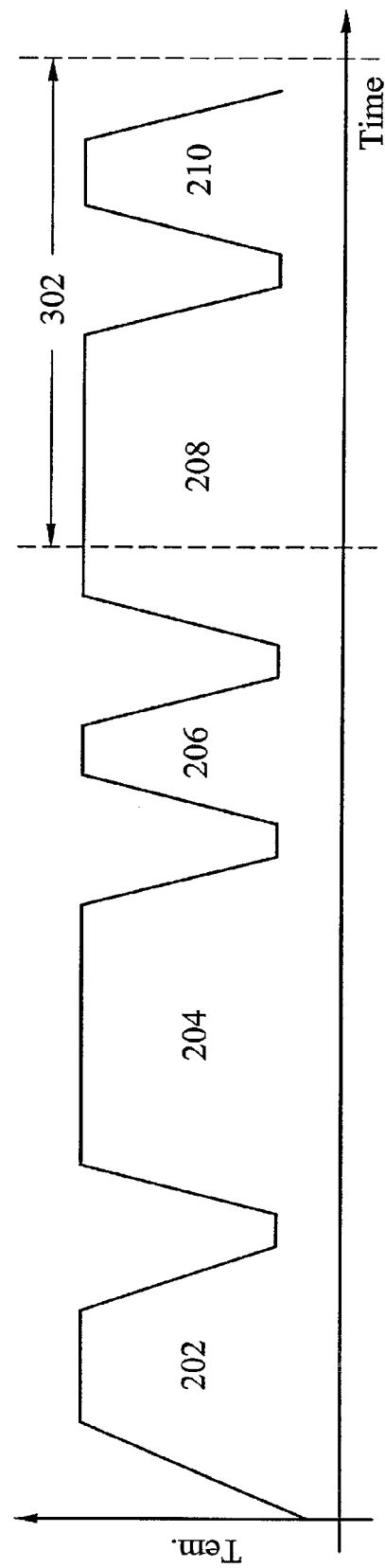
FIG. 4 is a chart showing the thermal cycles required in the conventional method.

Comparing FIG. 3 and FIG. 4, due to only one required thermal cycle of the invention when depositing the barrier layer 202, the lower IMD layer 204, the stop layer 206, the upper IMD layer 208 and the ARC layer 210, embodiment of the invention can reduce processing time 302, thus increasing efficiency. Additionally, the thermal budget is reduced, eliminating voids or humps resulting from Cu stress migration and shrinkage of low k film.

Additionally, as shown in FIG. 5, since multiple layers 112 are deposited in one chamber, the tensile strength of the black diamond films are compensated by other compressive films, such as SiON or SiCN(SiN). Accordingly, the tensile stress of the films 112 deposited on the chamber walls 502 are reduced, decreasing possibility of particles 504 accumulating thereafter.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of thee appended claims should be accorded the broadest interpretation so as to encompass all such modifications and similar arrangements.

What is claimed is:

1. A method for forming dielectric layers, comprising:

placing a substrate in a chemical deposition chamber;

introducing a first precursor gas into the chamber while heating the substrate to an elevated temperature, thereby depositing a first dielectric layer on the substrate;

pumping out the first precursor gas from the chamber while maintaining the substrate in the chamber at the elevated temperature; and introducing a second precursor gas to the chamber without the first precursor gas while maintaining the substrate at the elevated temperature thereby depositing a second dielectric layer on the first dielectric layer, wherein the temperature is 300° C.~500° C.

2. The method as claimed in claim 1, further comprising:

pumping out the second precursor gas from the chamber while maintaining the substrate in the chamber at the elevated temperature;

introducing a third precursor gas to the chamber without the second precursor gas while maintaining the substrate at the elevated temperature thereby depositing a third dielectric layer on the second dielectric layer;

pumping out the third precursor gas from the chamber while maintaining the substrate in the chamber at the elevated temperature;

introducing a fourth precursor gas to the chamber while maintaining the substrate at the elevated temperature thereby depositing a fourth dielectric layer on the third dielectric layer;

pumping the fourth precursor gas out of the chamber while maintaining the substrate in the chamber at the elevated temperature; and introducing a fifth precursor gas to the chamber while maintaining the substrate at the elevated temperature thereby depositing a fifth dielectric layer on the fourth dielectric layer.

3. The method as claimed in claim 2, wherein at least one of the first, second and third dielectric layers is a low k dielectric layer.

4. The method as claimed in claim 3, wherein the low k layer is hydrogen doped silicon oxide carbide (SiOC:H, black diamond).

5. The method as claimed in claim 2, wherein the first, second, and third precursor gas are selected from the groups consisting of $SiH(CH3)3$ (TMS), $SiH4$, $N2O$, $NH3$, $O2$, $N2$ and He.

* * * * *